(12) United States Patent
Tae et al.

(10) Patent No.: US 8,575,777 B2
(45) Date of Patent: Nov. 5, 2013

(54) BATTERY MANAGEMENT SYSTEM AND DRIVING METHOD THEREOF

(75) Inventors: Yong-Jun Tae, Suwon-si (KR); Yusai Murakami, Suwon-si (KR); Gye-Jong Lim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1042 days.

(21) Appl. No.: 12/342,598

(22) Filed: Dec. 23, 2008

(65) Prior Publication Data

US 2010/0055543 A1   Mar. 4, 2010

(30) Foreign Application Priority Data

Aug. 26, 2008  (KR) .................. 10-2008-0083393

(51) Int. Cl.
*H01M 10/48* (2006.01)
(52) U.S. Cl.
USPC .......................................... 307/9.1; 320/136
(58) Field of Classification Search
USPC ............................ 307/9.1, 10.1; 320/134, 136
See application file for complete search history.

(56) References Cited

U.S. PATENT DOCUMENTS

| | | | |
|---|---|---|---|
| 6,020,717 A * | 2/2000 | Kadouchi et al. .............. | 320/116 |
| 6,313,637 B1 | 11/2001 | Iino et al. | |
| 7,663,341 B2 | 2/2010 | Lee et al. | |
| 8,212,525 B2 | 7/2012 | Iwata et al. | |
| 8,339,099 B2 | 12/2012 | Emori et al. | |
| 2008/0050645 A1 | 2/2008 | Kai et al. | |
| 2008/0086247 A1 * | 4/2008 | Gu et al. .......................... | 701/36 |
| 2008/0088279 A1 * | 4/2008 | Lim et al. ....................... | 320/134 |
| 2008/0100268 A1 | 5/2008 | Lim et al. | |
| 2010/0055543 A1 * | 3/2010 | Tae et al. ......................... | 429/50 |
| 2010/0295382 A1 * | 11/2010 | Tae et al. ........................ | 307/150 |
| 2012/0286734 A1 | 11/2012 | Miyazaki et al. | |

FOREIGN PATENT DOCUMENTS

| | | |
|---|---|---|
| JP | 11-150880 | 6/1999 |
| JP | 2000-270492 | 9/2000 |
| JP | 2000-294298 | 10/2000 |
| JP | 2003-017134 | 1/2003 |
| JP | 2003-070179 | 3/2003 |
| JP | 2004-215366 | 7/2004 |
| JP | 2006-191229 | 7/2006 |
| JP | 2006-296034 | 10/2006 |
| JP | 2007-335337 | 12/2007 |
| JP | 2008-035671 | 2/2008 |
| JP | 2008-118841 | 5/2008 |
| KR | 10-2007-0095612 | 10/2007 |

OTHER PUBLICATIONS

Japanese Office action dated Oct. 25, 2011, for corresponding Japanese Patent application 2008-76074, 2 pages.

(Continued)

*Primary Examiner* — Fritz M Fleming
(74) *Attorney, Agent, or Firm* — Christie, Parker & Hale, LLP (57) ABSTRACT

A battery management system (BMS) includes at least one sub-BMS and a main BMS. The at least one sub-BMS measures information about a battery, and generates an activation signal according to operating state. The main BMS receives the activation signal and determines the operating state of the at least two sub-BMSs. If the at least two sub-BMSs normally operate, the main BMS generates a synchronization signal and transfers the same to the sub-BMSs. The at least one sub-BMS measures the information about the battery according to the synchronization signal.

18 Claims, 7 Drawing Sheets

(56) References Cited

OTHER PUBLICATIONS

Patent Abstracts of Japan, and English machine translation of Japanese Publication 2006-296034, listed above, 9 pages.

SIPO Office action dated Dec. 31, 2011, for corresponding Chinese Patent application 200910168100.4, with English translation, 12 pages.

Japanese Office action dated Oct. 19, 2010, for corresponding Japanese Patent application 2008-276074.

KIPO Notice of Allowance dated Oct. 27, 2010, for Korean priority Patent application 10-2008-0083393.

Patent Abstracts of Japan and English machine translation of Japanese Publication 2000-270492 listed above.

Patent Abstracts of Japan and English machine translation of Japanese Publication 2003-071734 listed above.

SIPO Office action dated Oct. 18, 2012, for corresponding Chinese Patent application 200910168100.4, with English translation, (6 pages).

SIPO Decision of Rejection dated Feb. 17, 2013 for KR Application No. 2009-10168100.4 and English Translation (8 pages).

JPO Notice of Allowance dated Apr. 2, 2013, for corresponding Japanese Patent application 2008-276074, ( 2 pages).

SIPO Office action dated Aug. 15, 2013, with English translation, for Chinese Patent application 200910168100.4, (6 pages).

* cited by examiner

BATTERY MANAGEMENT SYSTEM AND DRIVING METHOD THEREOF

CROSS-REFERENCE TO RELATED APPLICATION

This application claims the benefit of Korean Patent Application No. 2008-83393, filed Aug. 26, 2008 in the Korean Intellectual Property Office, the disclosure of which is incorporated herein by reference.

BACKGROUND OF THE INVENTION

1. Field of the Invention

Aspects of the present invention relate to a battery management system and its driving method.

2. Description of the Related Art

Automobiles or other vehicles employing an internal combustion engine that uses gasoline or diesel oil as a primary fuel cause severe environmental pollution such as air pollution. In order to reduce such causes of environmental pollution, much effort has recently been made to develop electric vehicles or hybrid vehicles.

An electric vehicle is a vehicle using a battery engine operated by electrical energy outputted from a battery. Because an electric vehicle uses as its major driving source a battery having a plurality of secondary cells that can be discharged under use, recharged and formed as a pack, it is advantageous in that it does not generate an exhaust gas and has little noise.

A hybrid vehicle, which is intermediate between a vehicle using an internal combustion engine and an electric vehicle, uses two or more driving sources, for example, an internal combustion engine and a battery engine. Also currently under development are hybrid vehicles that may use an internal combustion engine and fuel cells directly creating electrical energy through a chemical reaction while oxygen and hydrogen are continuously supplied, or vehicles that may use both a battery and fuel cells. For a vehicle using a battery engine in order to improve the efficiency or environmental impact of the driving source, the number of battery cells in the battery must be large, so a battery management system (BMS) is required to effectively manage the plurality of battery cells.

The above information disclosed in this Background section is only for enhancement of understanding of the background of the invention and therefore it may contain information that does not form the prior art that is already known in this country to a person of ordinary skill in the art.

SUMMARY OF THE INVENTION

Aspects of the present invention provide a battery management system (BMS) and its driving method managing a plurality of battery cells. An example embodiment of the present invention provides a BMS including: at least one sub-BMS that measures information about a battery and generates an activation signal according to operating state; and a main BMS that receives the activation signal to determine the operating state of at least two sub-BMSs, generates a synchronization signal and transfers the same to the sub-BMSs if the at least two sub-BMSs are operating normally, wherein the at least one sub-BMS measures the information about the battery according to the synchronization signal.

Another embodiment of the present invention provides a method for driving a battery management system (BMS) incorporating at least two sub-BMSs, the method including: generating an activation signal by the at least two sub-BMSs according to operating state; determining the operating state of the at least two sub-BMSs upon receiving the activation signal, and generating a synchronization signal if the at least two sub-BMSs are operating normally; transferring the synchronization signal to the at least two sub-BMSs; and receiving information about a battery measured by the at least two sub-BMSs according to the synchronization signal.

As described above, according to aspects of the present invention, when a plurality of BMSs are driven, synchronizations of the BMSs can be matched, and accordingly, more accurate battery information can be obtained.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

In order to manage a plurality of battery cells, a battery management system (BMS) according to an embodiment of the present invention includes a plurality of sub-BMSs where each manages a corresponding one among the plurality of battery cells. When the plurality of sub-BMSs operates, they need to be synchronized with each other. If the plurality of sub-BMSs is not synchronized, information regarding the corresponding batteries would not be synchronized. The information to be synchronized from each battery includes information about the cell voltage of the battery and the current of the battery. The BMS and its driving method according to an embodiment of the present invention will now be described in detail with reference to the accompanying drawings.

Figure 1:
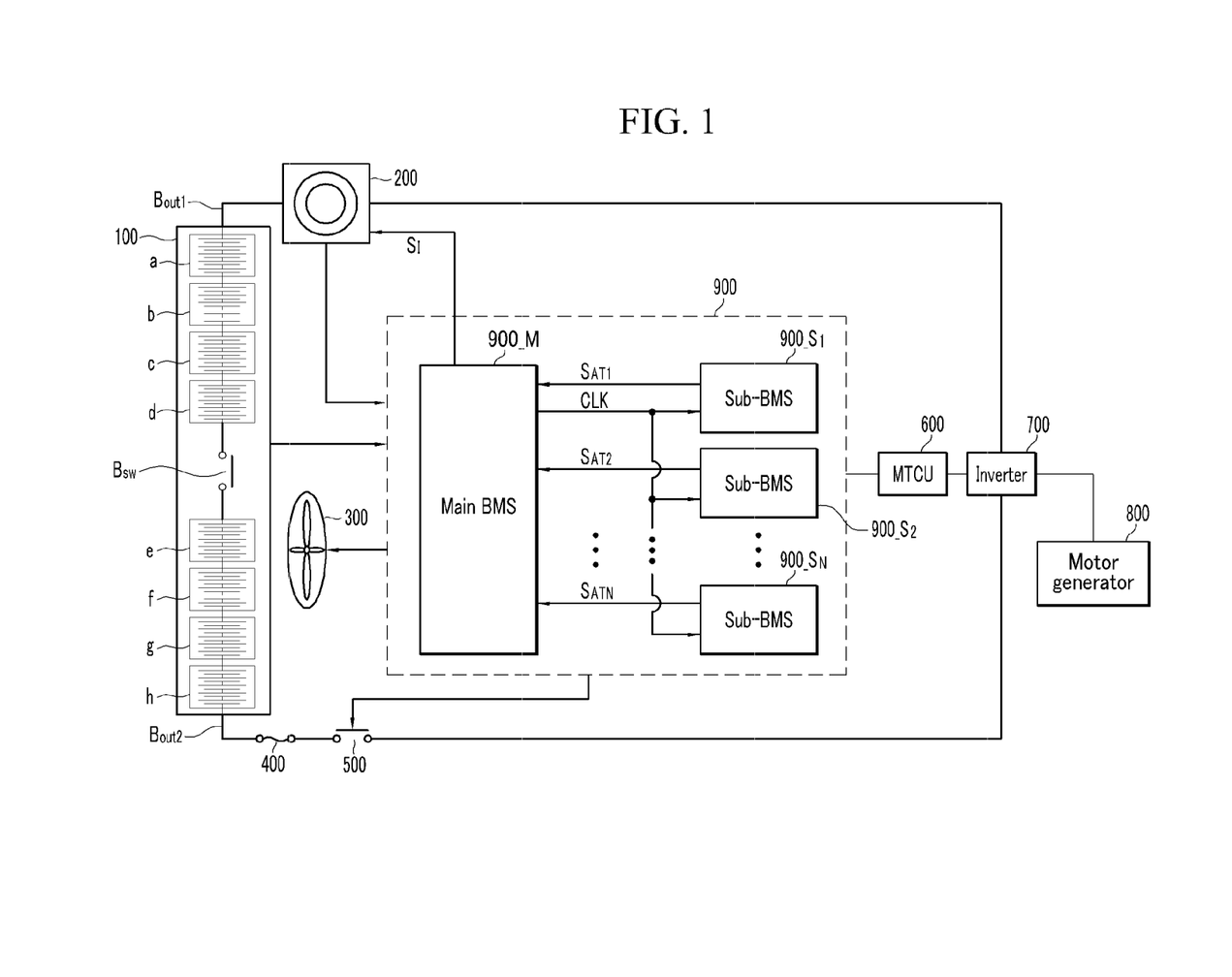
FIG. 1 is a schematic block diagram showing a battery, a battery management system (BMS) and its peripherals according to an embodiment of the present invention.
Figure 2:
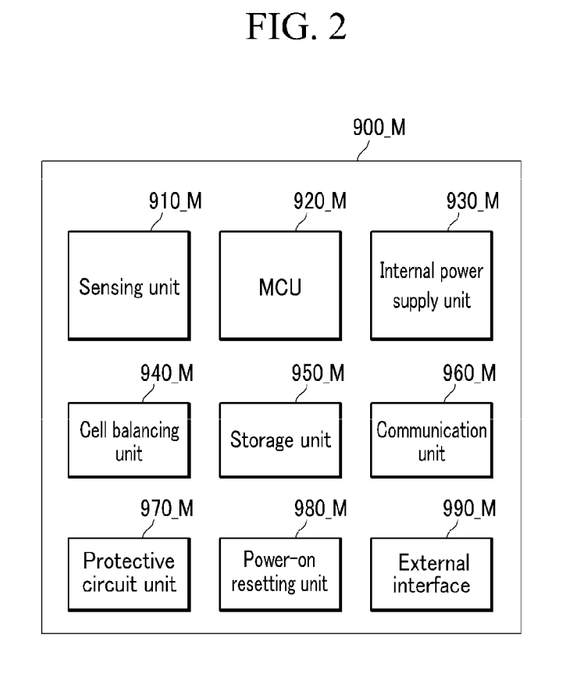
FIG. 2 is a schematic block diagram showing the configuration of the BMS of FIG. 1.

FIG. 1 is a schematic block diagram showing a battery, the BMS and its peripherals according to an embodiment of the present invention. FIG. 2 is a schematic block diagram showing the configuration of the BMS of FIG. 1. A vehicle system using a battery according to an embodiment of the present invention will now be described in detail.

As shown in FIG. 1, a vehicle system includes a battery 100, a current sensor 200, a cooling fan 300, a fuse 400, a main switch 500, an MTCU (Motor Control Unit) 600, an inverter 700, a motor generator 800 and a BMS 900. The BMS 900 according to this embodiment of the present invention includes a plurality of sub-BMSs $900\_S_1$, $900\_S_2$, ..., $900\_S_N$.

The battery 100 includes a plurality of sub-packs a to h, output terminals $B_{out1}$ and $B_{out2}$, and a safety switch $B_{SW}$ positioned between sub-packs d and e. The eight sub-packs a to h are shown as an example and the plurality of battery cells are shown as a single group, but the present invention is not limited thereto. When the battery is replaced or when an operation is performed on the battery, the safety switch $B_{SW}$ may be manually turned on or off for the safety of an operator. The location of the safety switch $B_{SW}$ is not limited to the location according to this embodiment of the present invention but may be placed at any location between the plurality of sub-packs a to h.

The current sensor 200 measures the amount of current flowing across the battery 100 and transfers the information to the BMS 900. As examples, the current sensor 200 may be a Hall CT (Current Transformer) that measures current by using a Hall element and outputs an analog current signal corresponding to the measured current, or may be a shunt resistor that generates a voltage signal corresponding to the current of the battery by connecting the resistor to a line through which the current of the battery flows.

When heat is generated due to charging or discharging of the battery 100, the cooling fan 300 cools the generated heat. The cooling fan 300 serves to prevent degradation of the battery 100 due to heat generated because of charging or discharging and therefore prevents degradation of charging/discharging efficiency.

The fuse 400 serves to prevent an overcurrent from being transferred to the battery 100 because of a disconnect or a short circuit of the battery 100. In particular, when an overcurrent occurs, the fuse 400 disconnects to prevent the overcurrent from being transferred to the battery 100.

When an abnormal phenomenon such as an overvoltage, an overcurrent, a high temperature or the like occurs, the main switch 500 turns the battery 100 on or off based on a control signal from the BMS 900 or the MTCU 600 of the vehicle.

The MTCU 600 recognizes the existing operating state of the vehicle based on information received from the accelerator, the brake, vehicle speed or the like; calculates a required torque; and controls power transmission between the battery 100 and the motor generator 800 based on the calculated torque and the state of charge (SOC) of the battery. Here, the current operating state of the vehicle may include an ON key for starting the vehicle, an OFF key for turning off a started vehicle, a subordinate operation, accelerator operation or the like. The inverter 700 provides for the battery 100 to be charged or discharged under the control of the MTCU 600. In detail, the MTCU 600 controls the inverter 700 to adjust output of the motor generator 800 such that it is suitable for a particular calculated torque. In addition, the MTCU 600 transmits information regarding the state of the vehicle to the BMS 900, receives an SOC of the battery 100 from the BMS 900, and controls power transmission between the battery 100 and the motor generator 800 such that the SOC of the battery 100 will reach a target value (e.g., 55 percent). For example, if the SOC transferred from the BMS 900 is less than 55 percent, the MTCU 600 controls the inverter 700 to transfer power of the motor generator 900 toward the battery 100. Then, the battery 100 is charged, and at this point, the current of the battery may be set to have a positive (+) value. If the SOC of the battery is more than 55 percent, the MTCU 600 controls the inverter 700 to transfer power from the battery 100 toward the motor generator 800. Then, the battery 100 is discharged, and at this point, the current of the battery may be set to have a negative (−) value. The motor generator 800 drives the vehicle based on the torque information transferred from the MTCU 600 by using electrical energy of the battery 100.

The BMS 900 includes the main BMS 900_M and the plurality of sub-BMSs $900\_S_1$-$900\_S_N$. The sub-BMSs $900\_S_1$-$900\_S_N$ each measure a cell voltage (V), the current and the temperature (T) of the battery, and the like, and transfers the same to the main BMS 900_M. The sub-BMSs $900\_S_1$-$900\_S_N$ transfer activation signals $S_{AT1}$-$S_{ATN}$ to the main BMS 900_M in order to transfer operating state information from the sub-BMSs $900\_S_1$-$900\_S_N$ to the main BMS 900_M. The operating state information from the sub-BMSs includes power-on states and power-off states. The power-on state refers to the normal operating state in which power is normally supplied to the sub-BMSs, and the power-off state refers to an abnormal operating state in which power is not normally supplied to the sub-BMSs. The activation signals $S_{AT1}$-$S_{ATN}$ indicate the power-on or power-off state of the sub-BMSs $900\_S_1$-$900\_S_N$. When power of the sub-BMSs is on, the activation signals $S_{AT1}$-$S_{ATN}$ have a high level, while when power of the sub-BMSs is off, the activation signals $S_{AT1}$-$S_{ATN}$ have a low level.

The main BMS 900_M receives the cell voltage (V) of the battery, the current (I) and temperature (T) of the battery or the like, and estimates the SOC and the state of health (SOH) of the battery. The main BMS 900_M controls charging and discharging of the battery based on the SOC and the SOH. When the main BMS 900_M receives the activation signals $S_{AT1}$-$S_{ATN}$ from the respective sub-BMSs $900\_S_1$-$900\_S_N$, it determines that the sub-BMSs $900\_S_1$-$900\_S_N$ are all in a state of operating normally, and the main BMS 900_M generates a synchronization signal CLK. The main BMS 900_M transfers the synchronization signal CLK to the respective sub-BMSs $900\_S_1$-$900\_S_N$, and the sub-BMSs $900\_S_1$-$900\_S_N$ operate according to the same synchronization signal CLK. That is, the main BMS 900_M drives the sub-BMSs $900\_S_1$-$900\_S_N$ by using the synchronization signal CLK to synchronize the sub-BMSs $900\_S_1$-$900\_S_N$.

The main BMS 900_M and the sub-BMSs $900\_S_1$-$900\_S_N$ according to this embodiment of the present invention include the same elements in terms of hardware, respectively, as shown in FIG. 2. That is, programs may be set differently according to the state of a switch (not shown) or according to setting of an identifier included in each of the main BMS 900_M and the sub-BMSs, so as to operate as the main BMS 900_M or as the sub-BMSs $900\_S_1$-$900\_S_N$. That is, the BMS may operate as the main BMS or sub-BMS according to a set program. In detail, with reference to FIG. 2, the main BMS 900_M includes a sensing unit 910_M, an MCU (Micro Control Unit) 920_M, an internal power supply unit 930_M, a cell balancing unit 940_M, a storage unit 950_M, a communication unit 960_M, a protective circuit unit 970_M, a power-on resetting unit 980_M and an external interface 990_M.

The sensing unit 910_M receives a control signal from the MCU 920_M, and measures the cell voltage (V), the current (I) and the temperature (T) of the battery, or the like, based on the control signal. In this case, the cell voltage (V), the current (I), and the temperature (T) of the battery are measured as analog values. The sensing unit 910_M converts the analog values of the cell voltage (V), the current (I), and the temperature (T) of the battery into digital values and transfers the same to the MCU 920_M.

Upon receiving the cell voltage (V), the current (I), and the temperature (T) of the battery from the sensing unit 910_M, the MCU 920_M estimates the SOC and the SOH of the battery. The internal power supply unit 930_M supplies power to the BMS 900 by using an auxiliary battery.

The cell balancing unit 940_M balances the SOC of each cell. That is, the cell balancing unit 940_M may discharge a cell with a relatively high SOC and charge a cell with a relatively low SOC.

The storage unit 950_M stores data information such as the current SOC, SOH or the like when power is off to the main BMS 900_M. Here, the storage unit 950_M may be a non-volatile storage device, e.g., an EEPROM (Electrically Erasable Programmable Read Only Memory), in which data can be electrically written or erased.

The communication unit 960_M communicates with the MTCU 600 of the vehicle. That is, the communication unit 960_M transmits information regarding the SOC and the SOH to the MTCU 600, or receives information regarding the state of the vehicle and transmits it to the MCU 920_M.

The protective circuit unit 970_M is a secondarily added circuit to protect the battery 100 against an overcurrent, an overvoltage, or the like, by using a hardware element. The power-on resetting unit 980_M resets the overall system when power of the main BMS 900_M is turned on. The external interface 990_M connects the cooling fan and the main switch 500 to the MCU 920_M.

Because the plurality of sub-BMSs 900_$S_1$-900_$S_N$ according to this embodiment of the present invention have the same elements as those of the main BMS 900_M, their detailed description will be omitted.

Figure 3:
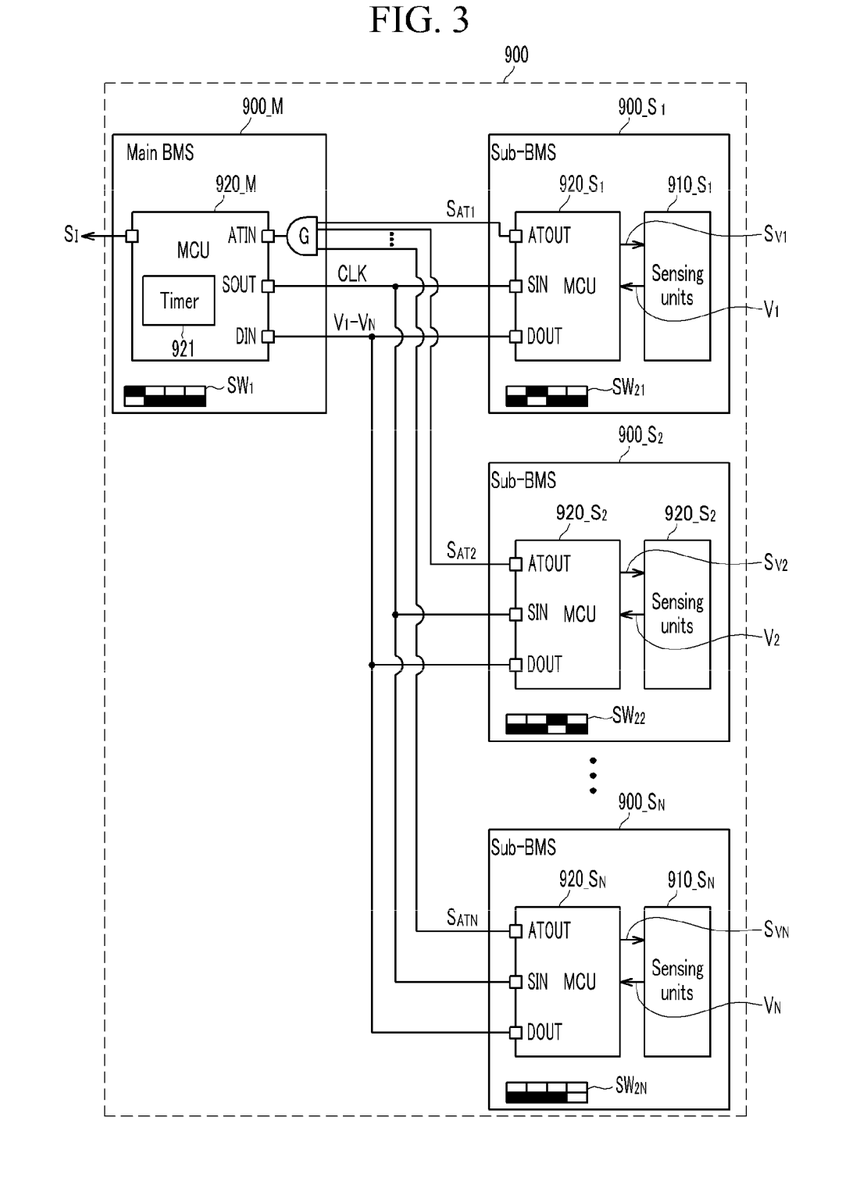
FIG. 3 is a schematic block diagram showing a BMS according to another embodiment of the present invention.
Figure 4:
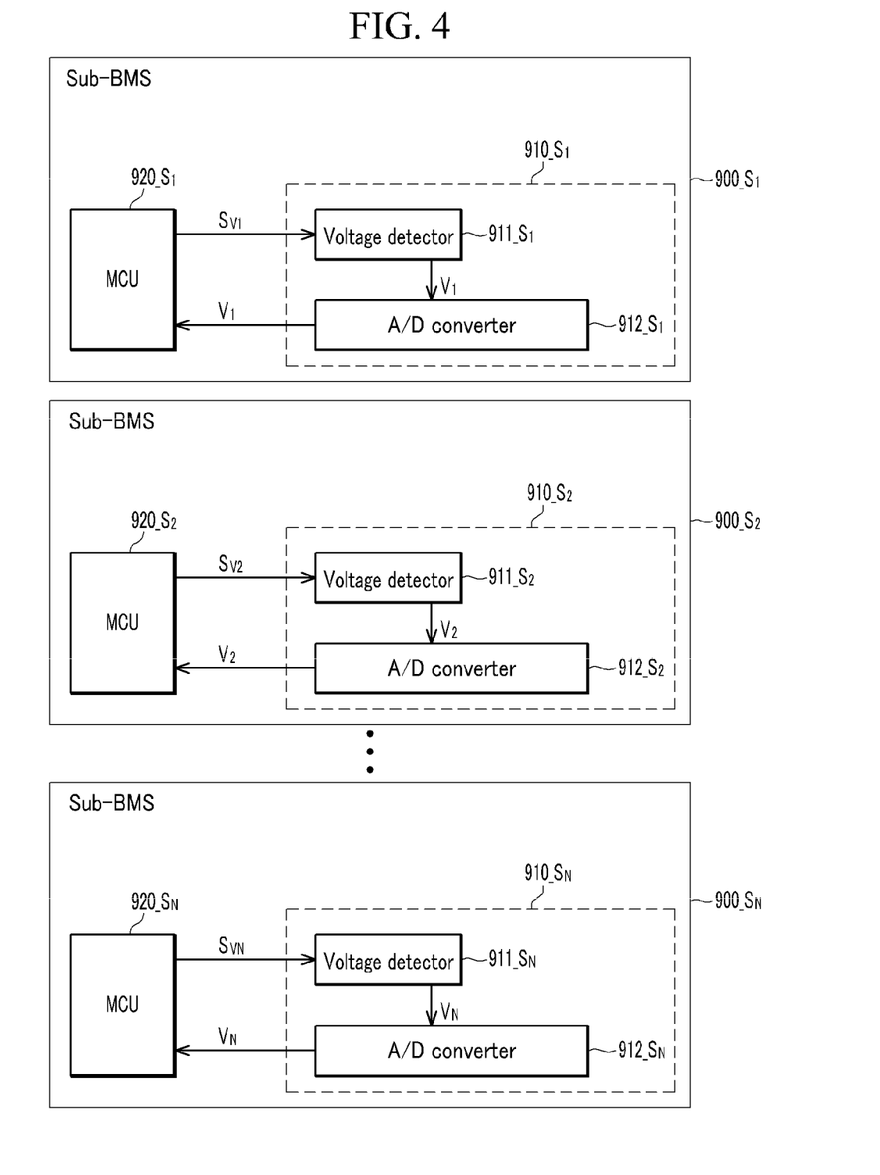
FIG. 4 is a schematic block diagram showing a sensing unit of the BMS of FIG. 3 in detail.
Figure 5:
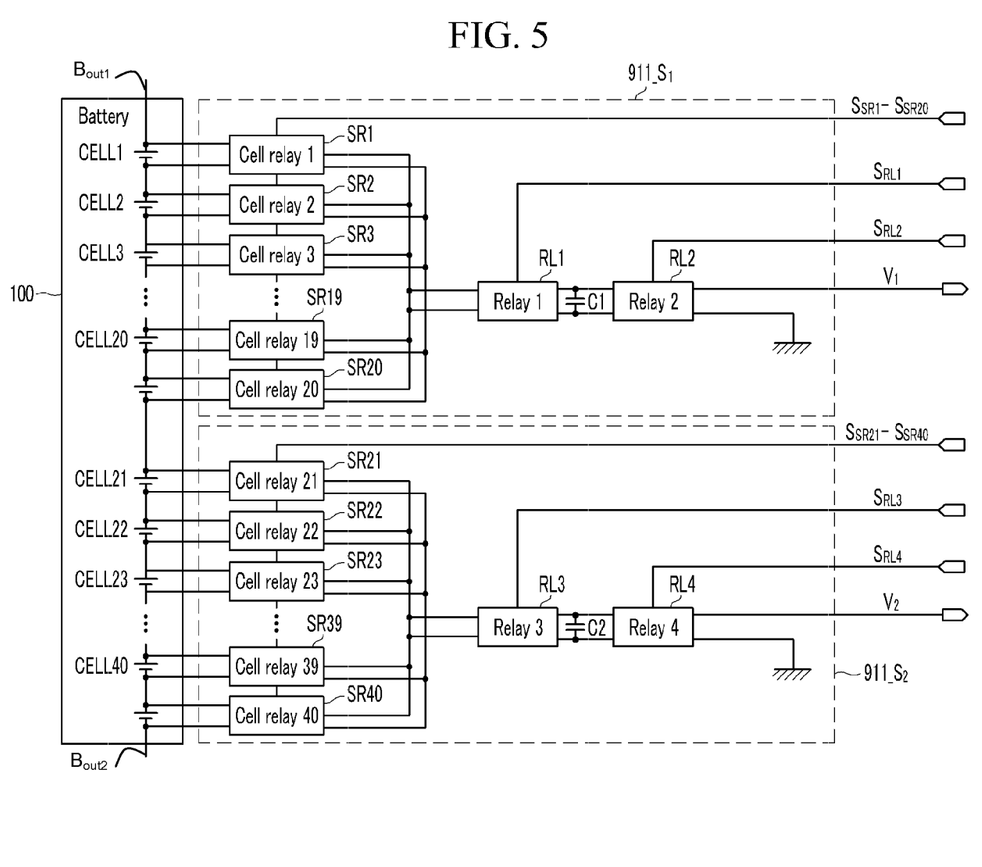
FIG. 5 is a schematic block diagram showing a voltage detection unit of the sensing unit of FIG. 4 in detail.
Figure 6:
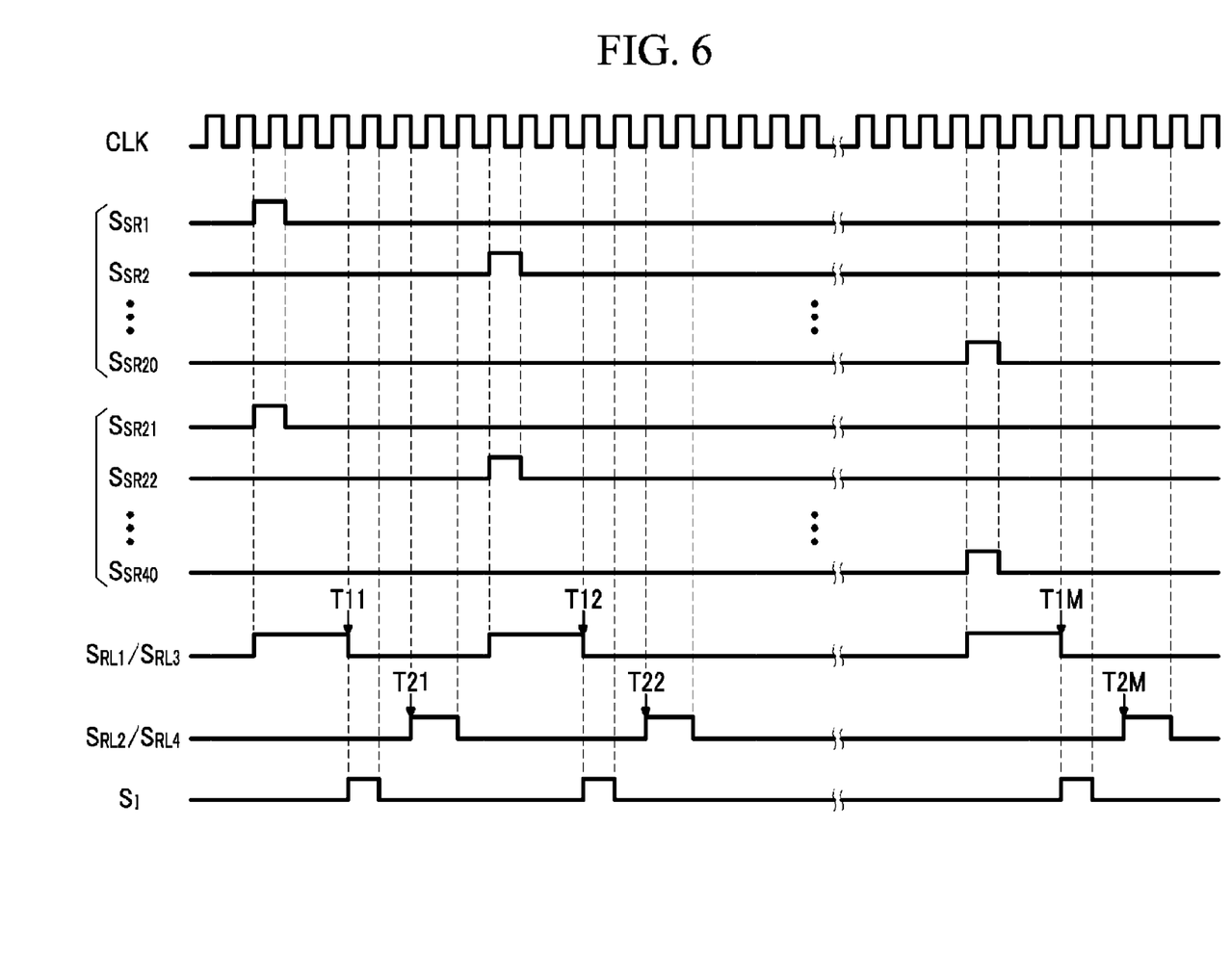
FIG. 6 is an illustration showing driving waveforms of the BMS of FIG. 3.
Figure 7:
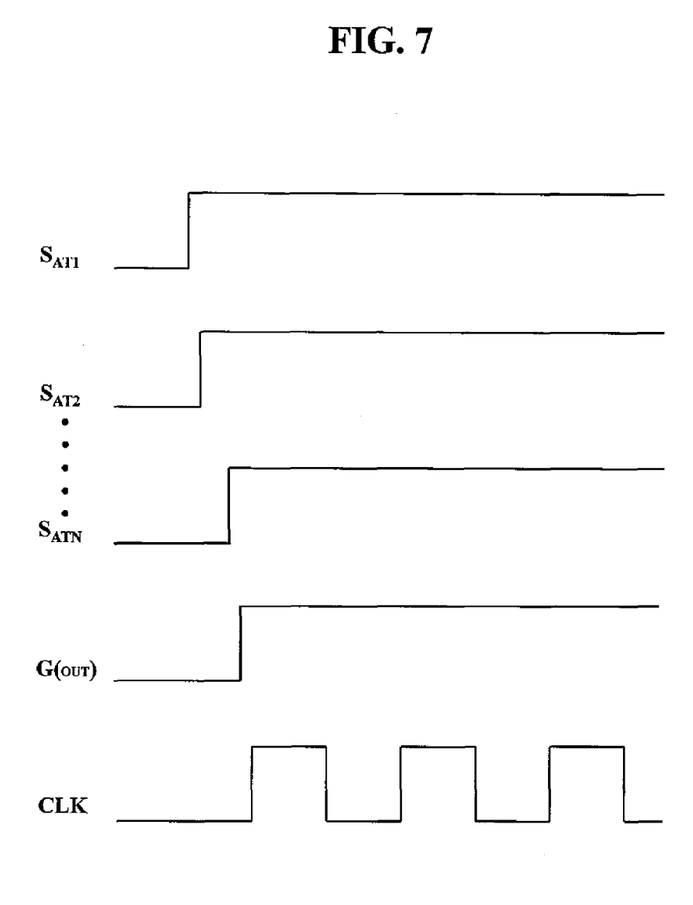
FIG. 7 is an illustration showing activation and synchronizing waveforms of the BMS of FIG. 3.

A synchronization control method in the BMS according to an embodiment of the present invention will now be described in detail with reference to FIGS. 3 to 6. FIG. 3 is a schematic block diagram showing a BMS according to another embodiment of the present invention. FIG. 4 is a drawing illustrating the sensing unit of the BMS of FIG. 3 in. FIG. 5 is a drawing illustrating a voltage detection unit of the sensing unit of FIG. 4 in detail. FIG. 6 is a graph showing driving waveforms of the BMS of FIG. 3. FIG. 7 is graph showing activation and synchronizing waveforms of the BMS of FIG. 3.

As shown in FIG. 3, the BMS 900 according to another embodiment of the present invention includes the main BMS 900_M and the plurality of sub-BMSs 900_$S_1$-900_$S_N$. In this embodiment of the present invention, only the MCU 920_M among the elements of the main BMS 900_M and only the MCUs 920_$S_1$-920_$S_N$ and the sensing units 910_$S_1$-910_$S_N$ among the elements of the sub-BMSs 900_$S_1$-900_$S_N$ are shown for example. The synchronization control method will now be described based on this example. In this embodiment as shown in FIG. 3, the sensing units 910_$S_1$-910_$S_N$ measure the cell voltage (V) and the current (I) of the battery. However, the present invention is not limited thereto. In this case, the cell voltage (V) of the battery includes cell voltages $V_1$-$V_N$ measured by the respective sensing units 910_$S_1$-910_$S_N$.

The main BMS 900_M includes the MCU 920_M and a switch $SW_1$. The MCU 920_M includes a timer 921 to generate a synchronization signal CLK, and receives the activation signals $S_{AT1}$-$S_{ATN}$ transferred from the respective sub-BMSs 900_$S_1$-900_$S_N$ via an activation input terminal ATIN. The MCU 920_M generates a synchronization signal CLK according to the activation signals $S_{AT1}$-$S_{ATN}$, and outputs the generated synchronization signal CLK to the respective sub-BMSs 900_$S_1$-900_$S_N$ via a synchronization signal output terminal SOUT.

The MCU 920_M receives information about the battery, e.g., the cell voltage (V) of the battery, obtained by the MCUs 920_$S_1$-920_$S_N$ of the sub-BMSs 900_$S_1$-900_$S_N$ via a data input terminal DIN. The MCU 920_M controls the current sensor 200 in synchronization with a time point when the cell voltage (V) is measured according to the synchronization signal CLK in the sub-BMSs 900_$S_1$-900_$S_N$, to measure the current (I) of the battery. The MCU 920_M estimates the SOC and the SOH of the battery by using the information about the battery.

In detail, the MCU 920_M receives the activation signals $S_{AT1}$-$S_{ATN}$ from the respective sub-BMSs 900_$S_1$-900_$S_N$. In this case, the input terminal ATIN is connected with an output terminal of an AND gate (G), and corresponding activation signals are inputted to each of a plurality of input terminals of the AND gate (G). Then, the activation signals $S_{AT1}$-$S_{ATN}$ transferred from the respective sub-BMSs 900_$S_1$-900_$S_N$ can be received via the single activation input terminal ATIN and processed. However, the present invention is not limited thereto, and the main BMS 900_M may receive the activation signals $S_{AT1}$-$S_{ATN}$ via the activation input terminal ATIN corresponding to each of the plurality of sub-BMSs 900_$S_1$-900_$S_N$. When all the activation signals $S_{AT1}$-$S_{ATN}$ are inputted via the activation input terminal ATIN, the MCU 920_M generates the synchronization signal CLK by using the timer 921. The MCU 920_M then transfers the synchronization signal CLK to the MCUs 920_$S_1$-920_$S_N$ of the sub-BMSs 900_$S_1$-900_$S_N$.

The switch SW1 may have a value set to be recognized by the main BMS 900_M, and may have different values according to user settings. The sub-BMSs 900_$S_1$-900_$S_N$ include the sensing units 910_$S_1$-910_$S_N$ to measure information about the battery, MCUs 920_$S_1$-920_$S_N$ to obtain information about the battery, and switches $SW_{21}$-$SW_{2N}$.

The MCUs 920_$S_1$-920_$S_N$ transfer the activation signals $S_{AT1}$-$S_{ATN}$ to the main BMS 900_M via activation output terminals ATOUT, and receive the synchronization signal CLK via synchronization signal input terminals SIN. In order to measure the information about the battery, the MCUs 920_$S_1$-920_$S_N$ generate control signals, e.g., voltage control signals $S_{V1}$-$S_{VN}$, in synchronization with the synchronization signal CLK and transfer them to the sensing units 910_$S_1$-910_$S_N$, respectively. The MCUs 920_$S_1$-920_$S_N$ transfer the cell voltage (V) of the battery measured by the respective sensing units 910_$S_1$-910_$S_N$ to the MCU 920_M of the main BMS 900_M via the data output terminal DOUT.

The sensing units 910_$S_1$-910_$S_N$ measure the information about the battery according to the received control signal and transfer the same to the MCUs 920_$S_1$-920_$S_N$. In detail, as shown in FIG. 4, the sensing units 910_$S_1$-910_$S_N$ according to this embodiment of the present invention may include voltage detectors 911_$S_1$-911_$S_N$ and A/D converters 912_$S_1$-912_$S_N$, respectively.

The voltage detectors 911_$S_1$-911_$S_N$ receive voltage control signals $S_{V1}$-$S_{VN}$ from the respective MCUs 920_$S_1$-

$920\_S_N$. The voltage detectors $911\_S_1$-$911\_S_N$ measure the cell voltages ($V_1$-$V_n$) of the battery according to the voltage control signals $S_{V1}$-$S_{VN}$ and transfer the same to the A/D converters $912\_S_1$-$912\_S_N$. According to this embodiment of the present invention, the voltage detectors $911\_S_1$-$911\_S_N$ of the sensing units $910\_S_1$-$910\_S_N$ have the same structure, so only the configuration of the voltage detector $911\_S_1$, among the voltage detectors $911\_S_1$-$911\_S_N$, will be described in detail.

With reference to FIG. 5, the voltage detector $911\_S_1$ includes a plurality of cell relays SR1-SR20, relays RL1 and RL2, and a capacitor C1. The voltage control signal $S_{V1}$ transferred to the voltage detector $911\_S_1$ includes cell relay control signals $S_{SR1}$-$S_{SR20}$ for controlling the plurality of cell relays SR1-SR20 and relay control signals $S_{RL1}$ and $S_{RL2}$ for controlling the relays RL1 and RL2. The cell relays SR1-SR20 are turned on when the cell relay control signals $S_{SR1}$-$S_{SR20}$ have a high level, and turned off when the cell relay control signals $S_{SR1}$-$S_{SR20}$ have a low level. The relays RL1 and RL2 are turned on when the relay control signals $S_{RL1}$ and $S_{RL2}$ have a high level, and turned off when the relay control signals $S_{RL1}$ and $S_{RL2}$ have a low level, respectively. In this embodiment, the battery 100 is shown to have forty cells and so the cell relays SR1-SR40 are limited to 40, but the present invention is not limited thereto, and the number of cell relays may be adjusted according to the total number of cells constituting the battery.

The plurality of cell relays SR1-SR20 is connected with positive and negative terminals to the plurality of cells CELL1-CELL20, respectively. The plurality of cell relays SR1-SR20 is determined to be turned on or off according to the cell relay control signals $S_{SR1}$-$S_{SR20}$ and transfers each voltage of the plurality of cells CELL1-CELL20 to the relay RL1. Then, the relay RL1 is determined to be turned on or off according to the relay control signal $S_{RL1}$, receives cell voltages of the battery transferred from the plurality of cell relays SR1-SR20, and transfers the same to the capacitor C1. The plurality of cell relays SR1-SR20 is turned on or off according to the plurality of cell relay control signals $S_{SR1}$-$S_{SR20}$. A cell voltage of the battery corresponding to a turned-on cell relay among the plurality of cells CELL1-CELL20 is transferred to the capacitor C1 via the turned-on relay RL1. A corresponding cell, among the plurality of cells of the battery, and the capacitor C1 are electrically connected via the cell relay which has been turned on by the cell relay control signals $S_{SR1}$-$S_{SR20}$ and the relay RL1 which has been turned on by the relay control signal $S_{RL1}$. Then, a detected voltage corresponding to the cell voltage of the battery via the path including the turned-on cell relay and the relay RL1 is stored in the capacitor C1. After the detected voltage corresponding to the cell voltage of the battery is charged in the capacitor C1, the relay RL2 is turned on according to the relay control signal $S_{RL2}$ with the lapse of a certain time and transfers the voltage stored in the capacitor C1 to the A/D converter $912\_S_1$. The A/D converter $912\_S_1$ converts the cell voltage ($V_1$) of the battery transferred in the form of analog data into digital data, and transfers the same to the MCU $920\_S_1$.

The voltage detector $911\_S_2$ has the same configuration and operates in the same manner as the voltage detector $911\_S_1$. Because the operation of the voltage detector $911\_S_2$ is controlled according to the same synchronization signal CLK, the cell relay control signals $S_{SR21}$-$S_{SR40}$ of the voltage detector $911\_S_2$ and the relay control signals $S_{RL3}$ and $S_{RL4}$ are synchronized with the control signal of the voltage detector $911\_S_1$.

Again, with reference to FIG. 3, the switches $SW_{21}$-$SW_{2N}$ may have a value set to be recognized by the sub-BMSs $900\_S_1$-$900\_S_N$ or may have a different value according to user settings. In this embodiment, the main BMS and the sub-BMSs are discriminated by using the switches $SW_1$, $SW_{21}$-$SW_{2N}$, but without being limited thereto, the main BMS and the sub-BMSs may be also discriminated by using identifiers.

The process of obtaining the information about the battery will now be described as an example of an operation for controlling synchronization in the plurality of BMSs, with reference to FIGS. 3 to 7. In this embodiment of the present invention, 'N' of the sub-BMSs $900\_S_1$-$900\_S_N$ is set to be 2. Here, the sub-BMS $900\_S_1$ measures the cell voltage ($V_1$) stored in the respective cells CELL1-CELL20 of the battery, the sub-BMS $900\_S_2$ measures the cell voltage ($V_2$) stored in the respective cells CELL21-CELL40 of the battery and the main BMS 900_M measures the current (I) of the battery.

The MCU 920_M of the main BMS 900_M receives a high level activation signal from the sub-BMSs $900\_S_1$ and $900\_S_2$. Then, the MCU 920_M determines that the sub-BMSs $900\_S_1$ and $900\_S_2$ are on, with reference to the received high level activation signal. In this case, because all the activation signals $S_{AT1}$ and $S_{AT2}$ have been inputted with the high level, the MCU 920_M generates the synchronization signal CLK by using the timer 921. Then the MCU 920_M transfers the synchronization signal CLK to the MCUs $920\_S_1$ and $920\_S_2$ of the sub-BMSs $900\_S_1$ and $900\_S_2$. Then, the MCUs $920\_S_1$ and $920\_S_2$ of the sub-BMSs $900\_S_1$ and $900\_S_2$ set the synchronization signal CLK as a basic clock signal and measures the cell voltages (V) of the battery. At this point, the MCU 920_M of the main BMS 900_M measures the current (I) of the battery in synchronization when the sub-BMSs $900\_S_1$ and $900\_S_2$ measure the cell voltage (V) of the battery.

In detail, the sub-BMS $900\_S_1$ generates the voltage control signal $S_{V1}$ and transfers the same to the voltage detector $911\_S_1$ so that the voltage of the cells CELL1-CELL20 can be measured in synchronization with the basic clock signal. Then, the voltage detector $911\_S_1$ sequentially turns on the cell relays SR1-SR20 to measure the cell voltage of the battery.

First, in order to measure the cell voltage ($V_1$) of the battery stored in the cell CELL1 in the sub-BMS $900\_S_1$, when the high level cell relay control signal $S_{SR1}$ is transferred in synchronization with the basic clock signal to the cell relay SR1 of the voltage detector $911\_S_1$ and the high level relay control signal $S_{RL1}$ is transferred in synchronization with the basic clock signal to the relay RL1, the cell voltage ($V_1$) of the battery stored in the cell CELL1 is stored in the capacitor C1 via the cell relay SR1 and the relay RL1.

After the lapse of a certain time from the time point T11 at which the low level relay control signal $S_{RL1}$ for turning off the relay RL1 is transferred, the MCU $920\_S_1$ of the sub-BMS $900\_S_1$ transfers the high level relay control signal $S_{RL2}$ to the relay RL2 to turn on the relay RL2. At the point T21 at which the relay RL2 is completely turned on, the voltage detector $911\_S_1$ of the sensing unit $910\_S_1$ measures a detection voltage corresponding to the cell voltage ($V_1$) of the battery stored in the capacitor C1 and transfers the same to the A/D converter $912\_S_1$. The A/D converter $912\_S_1$ converts the cell voltage ($V_1$) of the battery transferred in the form of analog data into digital data and transfers the same to the MCU $920\_S_1$. Then, the MCU $920\_S_1$ transfers the detected voltage corresponding to the converted cell voltage $V_1$ of the battery to the MCU 920_M of the main BMS 900_M.

Simultaneously, in the sub-BMS $900\_S_2$, in order to measure the voltage of the cells CELL21-CELL40 in synchronization with the basic clock signal, the voltage control signal $S_{V2}$ is generated and transferred to the voltage detector 911_$S_2$ of the sensing unit 910_$S_2$. Then, the voltage detector 911_$S_2$ sequentially turns on the cell relays SR21-SR40 to measure the cell voltage of the battery.

First, in order to measure the cell voltage ($V_2$) of the battery stored in the cell CELL21 in the sub-BMS 900_$S_2$, when the high level cell relay control signal $S_{SR1}$ is transferred in synchronization with the basic clock signal to the cell relay SR21 of the voltage detector 911_$S_2$ and the high level relay control signal $S_{RL3}$ is transferred in synchronization with the basic clock signal to the relay RL3, the cell voltage ($V_2$) of the battery stored in the cell CELL21 is stored in the capacitor C2 via the cell relay SR21 and the relay RL3.

After the lapse of a certain time from the point T11 at which the low level relay control signal $S_{RL3}$ for turning off the relay RL3 is transferred, the MCU 920_$S_2$ of the sub-BMS 900_$S_2$ transfers the high level relay control signal $S_{RL4}$ to the relay RL4 to turn on the relay RL4. At the point T21 at which the relay RL4 is completely turned on, the voltage detector 911_$S_2$ of the sensing unit 910_$S_2$ measures a detection voltage corresponding to the cell voltage ($V_2$) of the battery stored in the capacitor C2 and transfers the same to the A/D converter 912_$S_2$. The A/D converter 912_$S_2$ converts the cell voltage ($V_2$) of the battery transferred in the form of analog data into digital data and transfers the same to the MCU 920_$S_2$. Then, the MCU 920_$S_2$ transfers the detect voltage corresponding to the converted cell voltage $V_2$ of the battery to the MCU 920_M of the main BMS 900_M.

In this way, the MCU 920_M of the main BMS 900_M transfers the current control signal SI for controlling the current sensor 200 to measure the current (I) of the battery at the point T11 at which the cell voltage of the battery desired to be measured by the voltage detectors 911_$S_1$ and 911_$S_2$ of the sub-BMSs 900_$S_1$ and 900_$S_2$ are completely stored in the capacitors C1 and C2. At the point T11, the low level relay control signals $S_{RL1}$ and $S_{RL3}$ are transferred to the relays RL1 and RL3, respectively, to turn off the relays RL1 and RL3. And the MCU 920_M estimates the SOC and the SOH of the battery by using the current (I) of the battery and the cell voltages (V) of the battery.

In this manner, the respective MCUs 920_$S_1$ and 920_$S_2$ of the sub-BMSs 900_$S_1$ and 900_$S_2$ sequentially measure the cell voltages (V) of the battery stored in the cells CELL1-CELL20 and the cells CELL21-CELL40 according to the synchronization signal CLK. That is, while the sub-BMS 900_$S_1$ is measuring the cell voltage (V) of the battery stored in the cell CELL1 according to the synchronization signal CLK, the sub-BMS 900_$S_2$ also measures the cell voltage (V) of the battery stored in the cell CELL2 according to the synchronization signal CLK, and while the sub-BMS 900_$S_1$ is measuring the cell voltage (V) of the battery stored in the cell CELL21 according to the synchronization signal CLK, the sub-BMS 900_$S_2$ also measures the cell voltage (V) of the battery stored in the cell CELL22 according to the synchronization signal CLK. In this manner, the sub-BMSs 900_$S_1$ and 900_$S_2$ sequentially and simultaneously measure the voltages of the cells CELL1-CELL20 and the cells CELL21-CELL40 according to the synchronization signal CLK. Then the main BMS 900_M measures the current (I) of the battery at the time point when the cell voltages (V) of the battery is completely charged in the capacitor according to the synchronization signal CLK. Therefore, in the present invention, because the time for measuring the cell voltages (V) of the battery and the time for measuring the current (I) of the battery are synchronized, the generation of an error that may be otherwise caused by deviation between the measurement time point of the cell voltages (V) of the battery and the measurement time point of the current (I) of the battery can be prevented and thus accurate information can be obtained.

In the BMS according to the embodiments of the present invention, the synchronization signal CLK is generated and transferred to the sub-BMSs according to the results obtained by determining the power-on or power-off state of the sub-BMSs. Then, the sub-BMSs set the synchronization signal CLK as a basic clock signal and measure information about the battery such as the cell voltages of the battery, the current of the battery or the like. In this manner, when the plurality of BMSs is in use, their synchronizations are matched to thus obtain accurate information about the battery.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A battery management system (BMS) comprising:
at least two sub-BMSs configured to measure information about a battery and to generate an activation signal according to an operating state; and
a main BMS configured to receive the activation signal to determine the operating state of the at least two sub-BMSs, and to generate and transfer a synchronization signal to the sub-BMSs when the at least two sub-BMSs operate normally,
wherein the at least two sub-BMSs are configured to measure the information about the battery according to the synchronization signal.

2. The system of claim 1, wherein the main BMS is configured to generate the synchronization signal when the activation signal with a first level corresponding to a normal operating state is transferred from the at least two sub-BMSs.

3. The system of claim 1, wherein the at least two sub-BMSs comprise a sensing unit operable to measure the information about the battery according to the synchronization signal.

4. The system of claim 3, wherein the information about the battery comprises a cell voltage of the battery, and the sensing unit is configured to measure the cell voltage of the battery.

5. The system of claim 4, further comprising a voltage detector operable to measure the cell voltage of the battery, wherein the voltage detector comprises:
a plurality of cell relays connected with a plurality of cells of the battery, respectively,
a first relay connected with the plurality of cell relays and configured to sequentially transfer the cell voltages of the battery from the connected cell relays,
a capacitor for storing a detection voltage corresponding to the cell voltages of the battery transferred via the first relay,
a second relay connected with both ends of the capacitor, and
an A/D converter for converting the detection voltage transferred via the second relay into a digital signal.

6. The system of claim 5, wherein the main BMS is configured to measure a current of the battery at a storage completion time point when the detection voltage is completely stored in the capacitor, and the second relay is configured to be turned on after a lapse of a certain time from the storage completion time point.

7. A method of driving a battery management system (BMS) including at least two sub-BMSs comprising:
generating an activation signal by the at least two sub-BMSs according to an operating state;

determining the operating state of the at least two sub-BMSs upon receiving the activation signal, and generating a synchronization signal when the at least two sub-BMSs operate normally;

transferring the synchronization signal to the at least two sub-BMSs;

measuring information about a battery according to the synchronization signal, the information about the battery being measured by the at least two sub-BMSs; and receiving the information about the battery measured by the at least two sub-BMSs according to the synchronization signal.

8. The method of claim 7, wherein, in generating the synchronization signal, the synchronization signal is generated when the activation signal with a first level corresponding to a normal operation state is transferred from each of the at least two sub-BMSs.

9. The method of claim 7, wherein the information about the battery comprises a cell voltage of the battery, and the measuring of the information about the battery comprises measuring of the cell voltage of the battery by the at least two sub-BMSs.

10. The method of claim 9, wherein the measuring of the information about the battery comprises:

transferring the cell voltage of the battery via a first relay connected with one of a plurality of cell relays that are respectively connected with a plurality of cells of the battery, storing a detection voltage corresponding to the cell voltage of the battery transferred via the first relay in a capacitor, and transferring the detection voltage to an A/D converter via a second relay connected with both ends of the capacitor, so as to be converted into a digital signal.

11. The method of claim 10, wherein the receiving of the information about the battery comprises:

measuring the current of the battery at a storage completion time point when the detection voltage is completely stored in the capacitor, and turning on the second relay after a lapse of a certain time from the storage completion time point.

12. The method of claim 7, wherein the generation of the activation signal comprises:

generating the activation signal according to a power-on or power-off state of the at least two sub-BMSs, and receiving the activation signal from each of the at least two sub-BMSs.

13. The system of claim 1, wherein the main BMS and the at least two sub-BMSs comprise a sensing unit, a micro control unit, an internal power supply unit, a cell balancing unit, a storage unit, a communication unit, a protective circuit unit, a power-on resetting unit, and an external interface.

14. The system of claim 13, wherein the micro control unit of the main BMS comprises a timer, a switch, a data input terminal, an activation input terminal, a signal output terminal and an AND gate.

15. The system of claim 13, wherein the micro control unit of each sub-BMS comprises a switch, a data output terminal, an activation output terminal, and a signal input terminal.

16. The system of claim 13, wherein the sensing unit of each comprises a voltage detector and an analog to digital converter.

17. A vehicle system comprising:
a plurality of battery cells in series;
a battery;
a main battery management system (BMS); and
at least two sub-battery management systems (sub-BMSs), wherein:
the at least two sub-BMSs are configured to measure information about the battery and generate activation signals according to an operating state,
the main BMS is configured to receive the activation signals to determine the operating state of the at least two sub-BMSs, and to generate and transfer a synchronization signal to the at least two sub-BMSs when the at least two sub-BMSs operate normally, and
the at least two sub-BMSs are configured to measure the information about the battery according to the synchronization signal.

18. A method of matching a synchronization of a plurality of battery management systems (BMSs) comprising a main BMS, at least two sub-BMSs, and a plurality of battery cells organized in a battery stack, the method comprising:

determining a power-on or power-off state of each of the at least two sub-BMSs;

generating an activation signal from each of the sub-BMS in the power-on state;

transmitting the activation signal through an AND gate to the main BMS;

when all of the at least two sub-BMSs are in the power-on state, generating a synchronization signal in the main BMS;

transmitting the synchronization signal to the at least two sub-BMSs;

detecting a voltage sequentially in each of the plurality of battery cells associated with a specific one of the at least two sub-BMSs according to the synchronization signal;

simultaneously detecting the voltage in corresponding battery cells of each other of the at least two sub-BMSs; and subsequently determining a current of the battery.

* * * * *

UNITED STATES PATENT AND TRADEMARK OFFICE
CERTIFICATE OF CORRECTION

| | | |
|---|---|---|
| PATENT NO. | : 8,575,777 B2 | Page 1 of 1 |
| APPLICATION NO. | : 12/342598 | |
| DATED | : November 5, 2013 | |
| INVENTOR(S) | : Yongjun Tae et al. | |

It is certified that error appears in the above-identified patent and that said Letters Patent is hereby corrected as shown below:

On the Title Page

Item (57) Abstract, line 4           After "to"

Insert -- an --

In the Claims

Column 12, Claim 16, line 9          After "each"

Insert -- sub-BMS --

Column 12, Claim 18, line 35         Delete "sub-BMS"

Insert -- sub-BMSs --

Signed and Sealed this
Tenth Day of November, 2015

Michelle K. Lee
*Director of the United States Patent and Trademark Office*